(12) United States Patent
Chiyonobu et al.

(10) Patent No.: US 9,691,740 B2
(45) Date of Patent: Jun. 27, 2017

(54) STACKED SEMICONDUCTOR DEVICE AND METHOD OF CONTROLLING THEREOF

(71) Applicant: FUJITSU LIMITED, Kawasaki-shi, Kanagawa (JP)

(72) Inventors: Akihiro Chiyonobu, Yokohama (JP); Hironori Kawaminami, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/197,832

(22) Filed: Jun. 30, 2016

(65) Prior Publication Data

US 2017/0026036 A1     Jan. 26, 2017

(30) Foreign Application Priority Data

Jul. 22, 2015   (JP) .................................. 2015-144887

(51) Int. Cl.
*H01L 25/065*     (2006.01)
(52) U.S. Cl.
CPC .. *H01L 25/0657* (2013.01); *H01L 2224/0401* (2013.01); *H01L 2224/06181* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01); *H01L 2225/06513* (2013.01); *H01L 2225/06548* (2013.01); *H01L 2924/15192* (2013.01); *H03K 2217/0036* (2013.01)
(58) Field of Classification Search
CPC ....... H01L 25/0657; H01L 2225/06503; H01L 2225/06513; H01L 2225/06541; H01L 2225/06548

USPC .......................... 327/519, 564, 565; 361/803
See application file for complete search history.

(56) References Cited

U.S. PATENT DOCUMENTS

| | | | |
|---|---|---|---|
| 2008/0151676 A1 | 6/2008 | Mizutani | |
| 2010/0008058 A1 | 1/2010 | Saen et al. | |
| 2013/0279276 A1* | 10/2013 | Schaefer | ................. G11C 7/00 |
| | | | 365/189.011 |
| 2015/0137875 A1* | 5/2015 | Ko | ....................... H03K 17/687 |
| | | | 327/535 |

FOREIGN PATENT DOCUMENTS

| | | |
|---|---|---|
| JP | 2008-153576 | 7/2008 |
| JP | 2009-277334 | 11/2009 |
| JP | 2010-021306 | 1/2010 |
| JP | 2014-002826 | 1/2014 |

* cited by examiner

*Primary Examiner* — William Hernandez
(74) *Attorney, Agent, or Firm* — Fujitsu Patent Center

(57) ABSTRACT

A semiconductor device includes: a plurality of semiconductor chips which are stacked; a plurality of circuit blocks respectively included in the plurality of semiconductor chips; a first power supply domain that supplies power and stops the supply of the power to one of the plurality of circuit blocks independently of the other circuit blocks; and a second power supply domain that supplies power and stops the supply of the power to at least two of the plurality of circuit blocks in common and supplies the power and stops the supply of the power independently of the other circuit blocks.

8 Claims, 13 Drawing Sheets

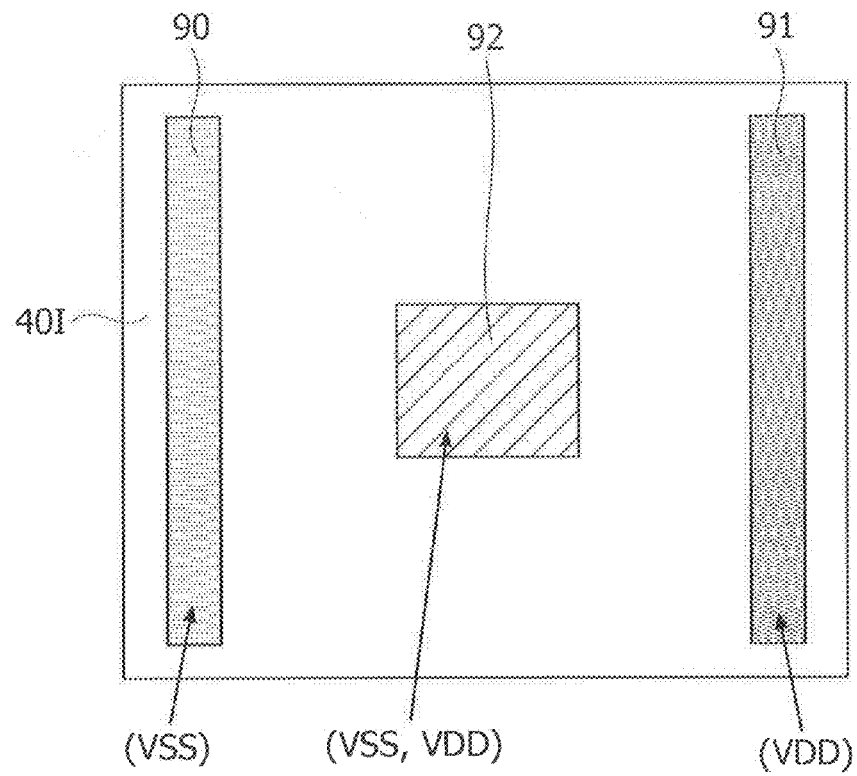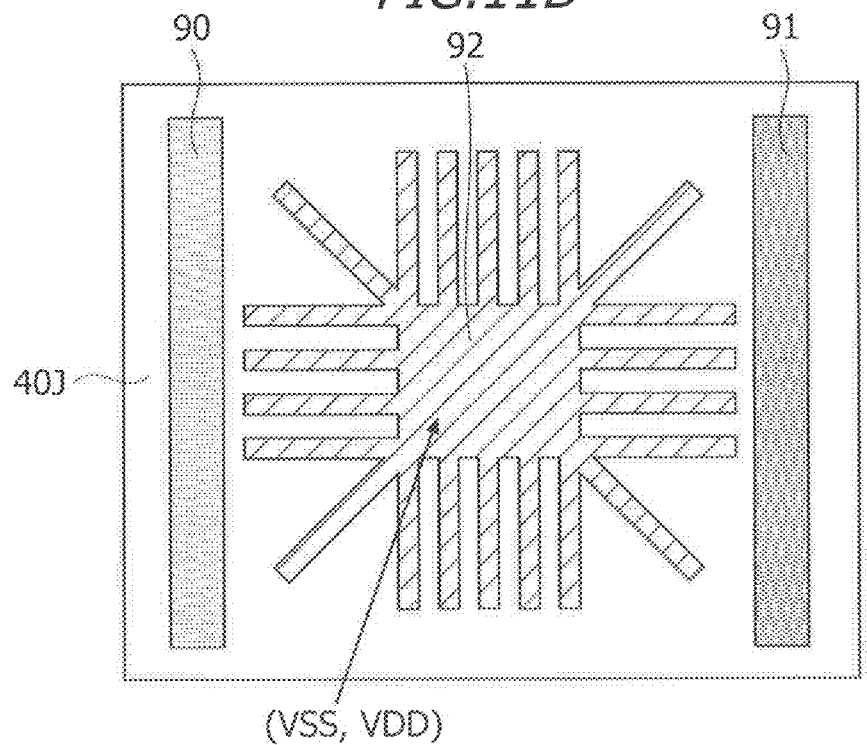

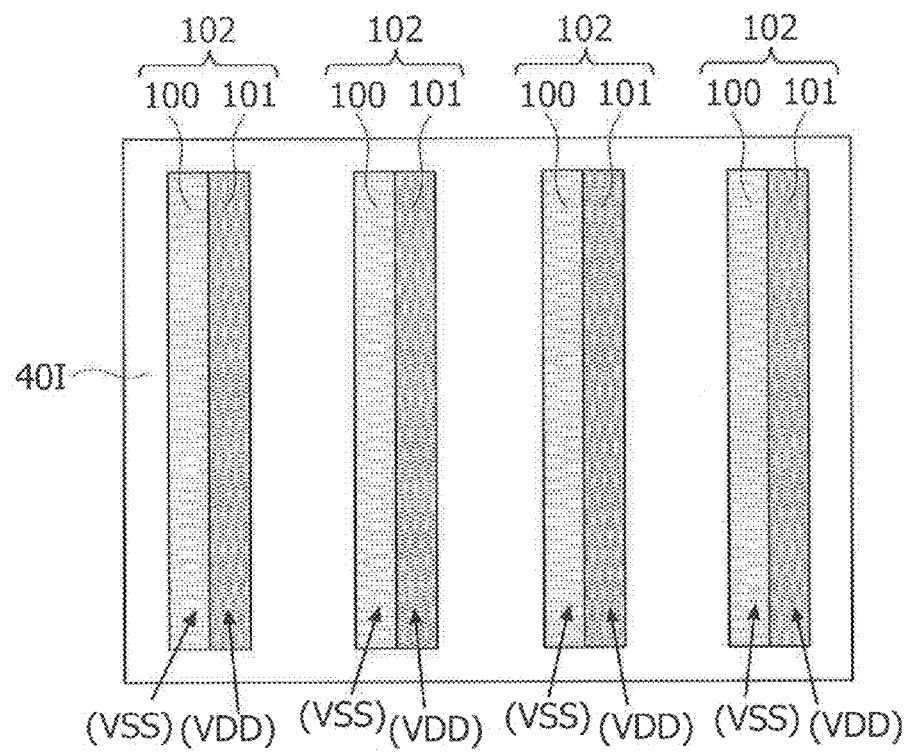
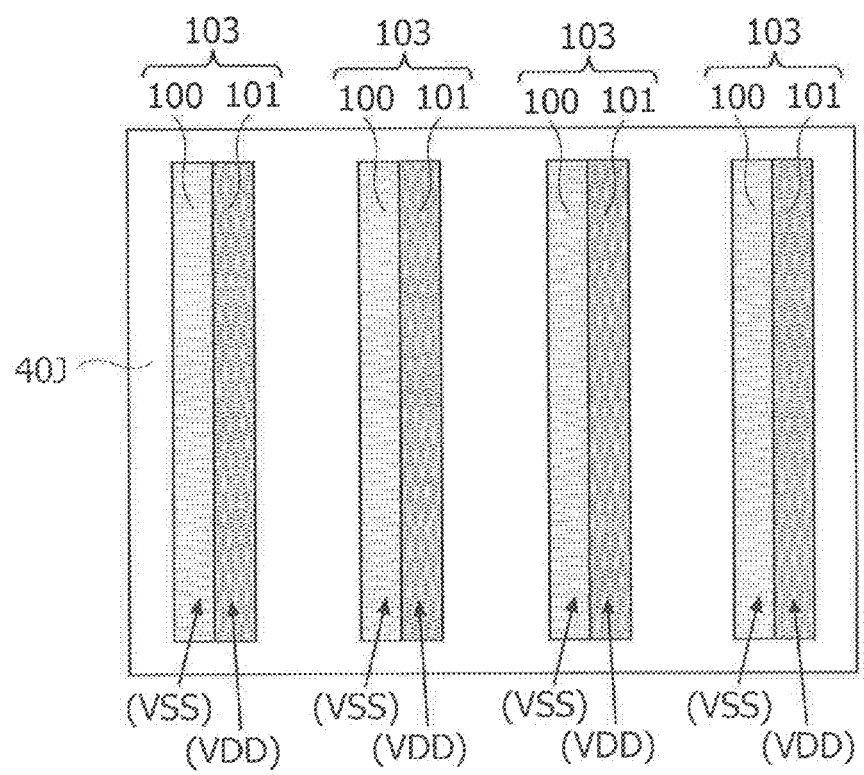

STACKED SEMICONDUCTOR DEVICE AND METHOD OF CONTROLLING THEREOF

CROSS-REFERENCE TO RELATED APPLICATION

This application is based upon and claims the benefit of prior Japanese Patent Application No. 2015-144887 filed on Jul. 22, 2015, the entire contents of which are incorporated herein by reference.

FIELD

An embodiment relates to a semiconductor device and a method for controlling the semiconductor device.

BACKGROUND

To further increase the density of a semiconductor product and improve the performance of the semiconductor product by shortening a wiring length between circuits, a 2.5-dimensional stacking technology and a three-dimensional stacking technology for a semiconductor chip have been attracting attention. In the 2.5-dimensional stacking technology for a semiconductor chip, a plurality of semiconductor chips (dies) are loaded adjacent to one another on a silicon interposer. In the three-dimensional stacking technology for a semiconductor chip, a plurality of semiconductor chips are stacked, and the plurality of semiconductor chips are connected to one another by being each penetrated by a TSV (Through Silicon Via).

[Patent document 1] Japanese Laid-open Patent Publication No. 2008-153576
[Patent document 2] Japanese Laid-open Patent Publication No. 2010-21306
[Patent document 3] Japanese Laid-open Patent Publication No. 2009-277334
[Patent document 4] Japanese Laid-open Patent Publication No. 2014-2826

SUMMARY

According to an aspect of the embodiment, a semiconductor device includes: a plurality of semiconductor chips which are stacked; a plurality of circuit blocks respectively included in the plurality of semiconductor chips; a first power supply domain that supplies power and stops the supply of the power to one of the plurality of circuit blocks independently of the other circuit blocks; and a second power supply domain that supplies power and stops the supply of the power to at least two of the plurality of circuit blocks in common and supplies the power and stops the supply of the power independently of the other circuit blocks.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 11A is a diagram illustrating an example of a structure of a power supply network in the semiconductor device according to the embodiment;

FIG. 11B is a diagram illustrating an example of a structure of a power supply network in the semiconductor device according to the embodiment;

FIG. 12A is a diagram illustrating an example of a structure of a power supply network in the semiconductor device according to the embodiment;

FIG. 12B is a diagram illustrating an example of a structure of a power supply network in the semiconductor device according to the embodiment;

DESCRIPTION OF EMBODIMENTS

An embodiment will be described below with reference to the drawings. A configuration in the embodiment is exemplary, and a semiconductor device and a method for controlling the semiconductor device are not limited to the configuration in the embodiment.

In the three-dimensional stacking technology for a semiconductor chip, a plurality of semiconductor chips are stacked, and the plurality of semiconductor chips are connected to one another in a height direction by the TSV, a bump, or the like. Since the plurality of semiconductor chips are stacked in the height direction, a package density per unit area is improved. The number of pins (electrodes) per unit area in the stacked semiconductor chips (hereinafter also referred to as a multilayer chip or a semiconductor device) does not increase. Therefore, while power consumption in the entire multilayer chip increases, the number of pins, which are usable to supply power, does not increase. Thus, when sufficient power is not supplied to each of the semiconductor chips in the multilayer chip, a voltage drop (a drop of a power supply voltage) in the semiconductor chip occurs so that the semiconductor chip may incorrectly operate. When the power consumption in the multilayer chip increases, heat generation by the multilayer chip increases. When heat generated in the multilayer chip is insufficiently exhausted, a temperature in the multilayer chip rises so that the semiconductor chip may incorrectly operate. Therefore, the heat generation by the multilayer chip has been expected to be suppressed.

Figure 1:
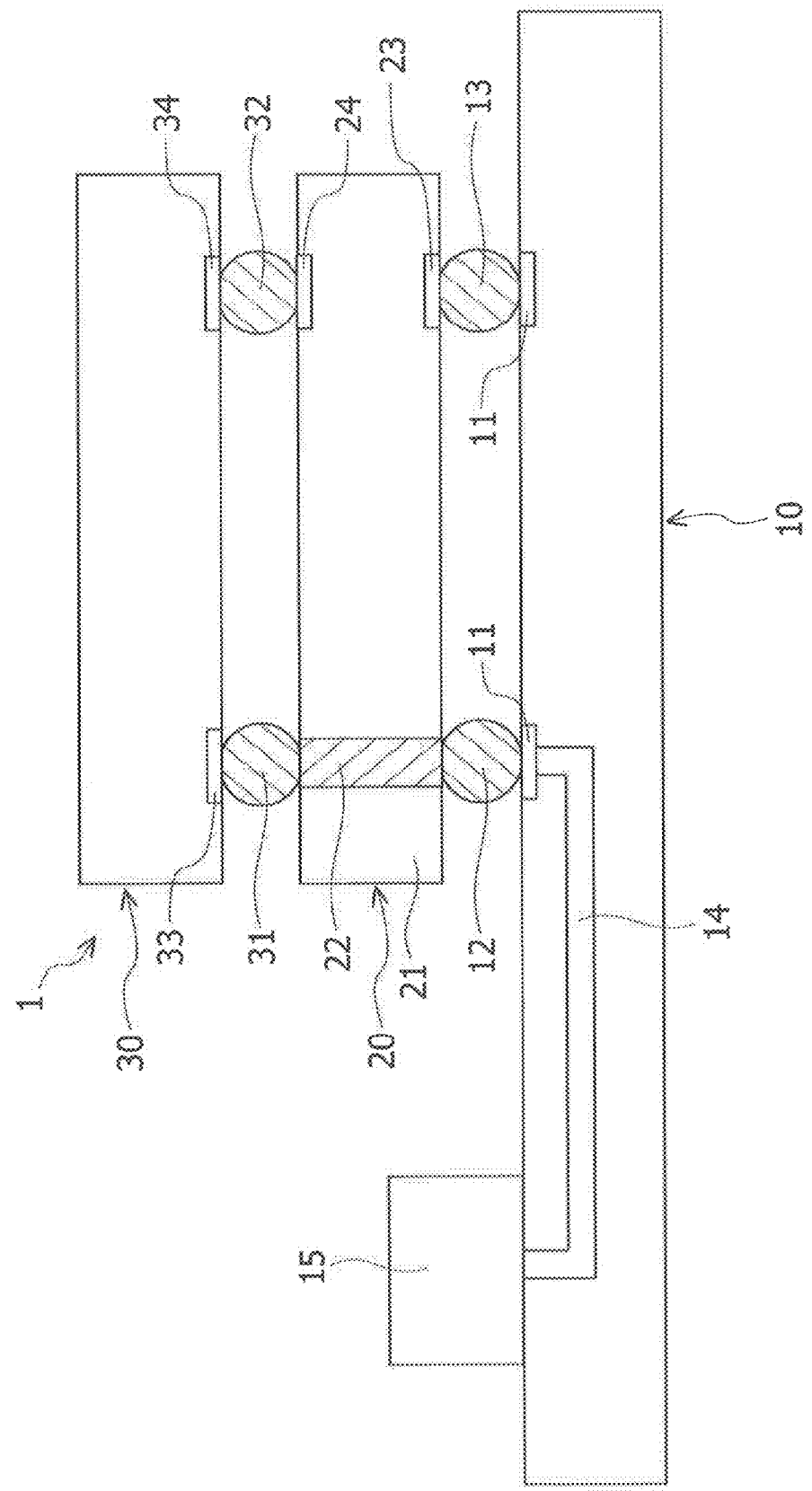
FIG. 1 is a diagram illustrating an example of a configuration of a semiconductor device according to an embodiment.

FIG. 1 is a diagram illustrating an example of a configuration of a semiconductor device 1 according to an embodiment. The semiconductor device 1 is a multilayer chip obtained by stacking a plurality of semiconductor chips. While the semiconductor device 1 including two layers of semiconductor chips is illustrated in FIG. 1, the embodiment is not limited to the semiconductor device 1 illustrated in FIG. 1. The semiconductor device 1 according to the embodiment may include three or more layers of semiconductor chips.

The semiconductor device 1 illustrated in FIG. 1 is stacked on a wiring substrate 10. The semiconductor device 1 illustrated in FIG. 1 includes a semiconductor chip (die) 20 and a semiconductor chip 30 that are stacked in a three-dimensional manner on the wiring substrate 10. In the semiconductor device 1 illustrated in FIG. 1, the semiconductor chip 30 is arranged on the semiconductor chip 20 with a circuit surface of the semiconductor chip 20 and a circuit surface of the semiconductor chip 30 opposing each other (Face to Face). The semiconductor chip 20 is stacked on the wiring substrate 10. Examples of the wiring substrate 10 include a printed circuit board, an interposer, and a ceramic substrate. A plurality of pads 11 are formed on an upper surface of the wiring substrate 10. Bumps 12 and 13 are respectively arranged on the pads 11. Examples of the bumps 12 and 13 include a solder ball.

The semiconductor chip 20 includes a silicon substrate 21 and a TSV 22 that penetrates the silicon substrate 21. A pad 23 is formed on an opposite surface to a circuit surface of the semiconductor chip 20. The bump 12 is joined to the pad 11 and the TSV 22. The bump 13 is joined to the pads 11 and 23. The wiring substrate 10 and the semiconductor chip 20 are electrically connected to each other via the pad 11, the bump 12, and the TSV 22. The wiring substrate 10 and the semiconductor chip 20 are electrically connected to each other via the pad 11, the bump 13, and the pad 23.

Bumps 31 and 32 are installed on the circuit surface of the semiconductor chip 20. Examples of the bumps 31 and 32 include a solder ball. The bump 31 is joined to the TSV 22. The bump 31 is jointed to a pad 33 formed on the circuit surface of the semiconductor chip 30. The bump 32 is jointed to a pad 24 formed on the circuit surface of the semiconductor chip 20. The bump 32 is jointed to a pad 34 formed on the circuit surface of the semiconductor chip 30. The semiconductor chip 20 and the semiconductor chip 30 are electrically connected to each other via the TSV 22, the bump 31, and the pad 33. The semiconductor chip 20 and the semiconductor chip 30 are electrically connected to each other via the pad 24, the bump 32, and the pad 34.

The wiring substrate 10 includes a wiring 14 formed in the wiring substrate 10 and a power supply IC (Integrated Circuit) 15 arranged on the wiring substrate 10. The wiring 14 is connected to the pad 11 and the power supply IC 15. Examples of the power supply IC 15 include a DC-DC (Direct Current-Direct Current) converter or a LDO (Low Drop Out). The DC-DC converter is also referred to as a switching regulator, and the LDO is also referred to as a linear regulator or a series regulator. The power supply IC 15 raises or lowers a voltage of power input from an external power supply, and supplies the power to the semiconductor device 1.

The semiconductor device 1 includes a plurality of power supply domains. The power supply domain is a region where power is supplied from outside the semiconductor device 1. The power supply domain is a region where power is supplied to a circuit block of the semiconductor device 1. Examples of the circuit block include a logical block (logical circuit) and a memory block (memory circuit). Power may be supplied to one circuit block from the one power supply domain, or power may be supplied to at least two circuit blocks from the one power supply domain. The power supply domain that supplies power to the one circuit block is hereinafter written as an independent power supply domain. The independent power supply domain is an example of a first power supply domain. The circuit block to which power is supplied from the independent power supply domain is hereinafter written as an independent circuit block. The power supply domain that supplies power to the at least two circuit blocks is hereinafter written as a common power supply domain. The common power supply domain is an example of a second power supply domain. The circuit block to which power is supplied from the common power supply domain is hereinafter written as a common circuit block. The semiconductor device 1 has at least one independent power supply domain. The semiconductor device 1 may have a plurality of independent power supply domains. The semiconductor device 1 has at least one common power supply domain. The semiconductor device 1 may have a plurality of common power supply domains.

When power is supplied to the independent circuit block from the independent power supply domain, the supply of the power and the stop of the supply of the power are performed to the independent circuit block independently of the other circuit block. When power is supplied to the at least two common circuit blocks from the common power supply domain, the supply of the power and the stop of the supply of the power are performed to the at least two common circuit blocks in common, and the supply of the power and the stop of the supply of the power are performed independently of the other circuit block. When the power supply is not separable due to constraints caused by respective physical package densities of the semiconductor chips and the circuit blocks and a logical relationship between the circuit blocks, for example, power is supplied to the at least two common circuit blocks from the common power supply domain.

Figure 2:
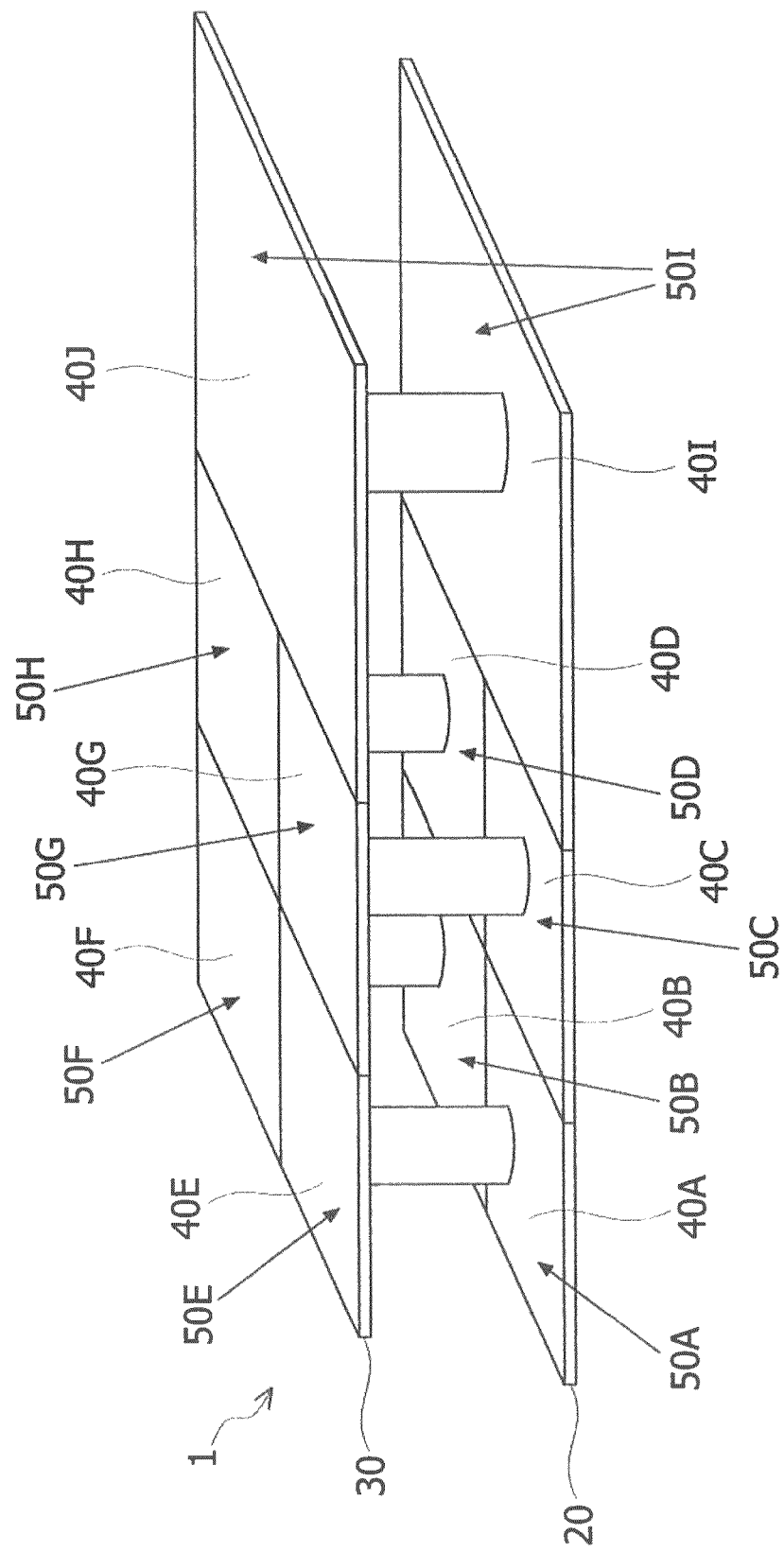
FIG. 2 is a schematic view of the semiconductor device according to the embodiment.

FIG. 2 is a schematic view of the semiconductor device 1 according to the embodiment. While the semiconductor device 1 including two layers of semiconductor chips 20 and 30 is illustrated in FIG. 2, the embodiment is not limited to the semiconductor device 1 illustrated in FIG. 2. The semiconductor device 1 according to the embodiment may include three or more layers of semiconductor chips. In an example illustrated in FIG. 2, the semiconductor chip 20 includes circuit blocks 40A to 40D and 40I, and the semiconductor chip 30 includes circuit blocks 40E to 40H and 40J. When one of the circuit blocks 40A to 40J is illustrated in the following description, the circuit blocks may be described as a circuit block 40. In an example illustrated in FIG. 2, the semiconductor chip 20 has power supply domains 50A to 50D, and the semiconductor chip 30 has power supply domains 50E to 50H. In an example illustrated in FIG. 2, the semiconductor chips 20 and 30 respectively have common power supply domains 50I. Each of the power supply domains 50A to 50H is an example of the first power supply domain. The power supply domain 50I is an example of the second power supply domain.

In the power supply domains 50A to 50H, the supply of power and the stop of the supply of the power are performed to the circuit blocks 40A to 40H independently of one another. For example, power is supplied to the circuit block 40A from the power supply domain 50A, and power is supplied to the circuit block 40B from the power supply domain 50B. The supply of the power and the stop of the supply of the power to the circuit block 40A are performed independently of the circuit blocks 40B to 40J. The supply of the power and the stop of the supply of the power to the circuit block 40B are performed independently of the circuit blocks 40A and 40C to 40J. Therefore, the supply of the power to the circuit block 40A can be stopped, and the supply of the power to the circuit block 40B can be continued.

A power supply voltage of the power supplied to the circuit block 40A from the power supply domain 50A and a power supply voltage of the power supplied to the circuit block 40B from the power supply domain 50B are independently controlled. For example, the power supply voltage of the power supplied to the circuit block 40A and the power supply voltage of the power supplied to the circuit block 40B can be respectively controlled to different values. The power supply voltage of the power supplied to the circuit block 40A and the power supply voltage of the power supplied to the circuit block 40B can also be controlled to the same value.

In the power supply domain 50I, the supply of the power and the stop of the supply of the power are performed to the circuit blocks 40I and 40J in common, and the supply of the power and the stop of the supply of the power are performed independently of the circuit blocks 40A to 40H. The power is supplied to the circuit blocks 40I and 40J from the power supply domain 50I, and the supply of the power to the circuit block 40I and the supply of the power to the circuit block 40J are controlled in common. That is, common power is supplied to the circuit blocks 40I and 40J from the power supply domain 50I. Therefore, the supply of the power to the circuit block 40I and the supply of the power to the circuit block 40J can be simultaneously stopped.

The respective power supply voltages of the power supplied to the circuit blocks 40I and 40J are controlled in common. Therefore, the power supply voltage of the power supplied to the circuit block 40I and the power supply voltage of the power supplied to the circuit block 40J are controlled to the same value.

The supply of the power in the power supply domains 50A to 50H and the supply of the power in the power supply domain 50I are independently controlled. Therefore, the supply of the power to the circuit blocks 40A to 40H and the supply of the power to the circuit blocks 40I and 40J are independently controlled. For example, the supply of the power to the circuit block 40A can be stopped, and the supply of the power to the circuit blocks 40I and 40J can be continued. For example, the supply of the power to the circuit blocks 40I and 40J can be stopped, and the supply of the power to the circuit block 40A can be continued.

The semiconductor device 1 may include a control circuit (control unit) that controls the supply of the power to the circuit blocks 40A to 40J, the stop of the supply of the power to the circuit blocks 40A to 40J, and changes in the respective power supply voltages supplied to the circuit blocks 40A to 40J. Processing for controlling the supply of the power to the circuit blocks 40A to 40J, the stop of the supply of the power to the circuit blocks 40A to 40J, and the changes in the respective power supply voltages supplied to the circuit blocks 40A to 40J is hereinafter also written as power supply control processing. Any one or a plurality of the circuit blocks 40A to 40J may function as a control circuit that performs power supply control processing. A control device (e.g., a processor such as a CPU (Central Processing Unit)) different from the semiconductor device 1 may perform power supply control processing. The control device may be provided on the wiring substrate 10.

An internal circuit of the semiconductor device 1 or an external device can stop (shut off) and resume the supply of the power to the circuit blocks 40A to 40J. When on or off of a power gating circuit formed in the semiconductor device 1 is controlled, the supply of the power to the circuit blocks 40A to 40J may be stopped or resumed. When a control signal is transmitted to the power gating circuit in the semiconductor device 1 from the control circuit or the control device, on or off of the power gating circuit is controlled. For example, the supply of the power to the circuit blocks 40A to 40J may be stopped or resumed by controlling on or off of a power switch arranged between the semiconductor device 1 and the power supply IC 15. When the control signal is transmitted to the power switch from the control circuit or the control device, on or off of the power switch is controlled.

When the power supply IC 15 is controlled, the power supply voltage of the power supplied to the circuit blocks 40A to 40J can be changed. When the control signal is transmitted to the power supply IC 15 from the control circuit or the control device, the power supply IC 15 is controlled. The semiconductor device 1 may include a power supply circuit that raises or lowers the power supply voltage of the power supplied from the power supply IC 15 and supplies the power to the circuit blocks 40A to 40J. In this case, when the power supply circuit in the semiconductor device 1 is controlled, the power supply voltage of the power supplied to the circuit blocks 40A to 40J can be changed. For example, when a control signal is transmitted to the power supply circuit in the semiconductor device 1 from the control circuit or the control device, the power supply circuit in the semiconductor device 1 is controlled.

The supply of a clock signal and the stop of the supply of the clock signal are performed to the circuit blocks 40A to 40J independently of one another. That is, the supply of the clock signal and the stop of the supply of the clock signal are performed independently for each of the circuit blocks 40A to 40J. The supply of the clock signal to the circuit block 40A and the supply of the clock signal to the circuit block 40B are independently controlled. Thus, the supply of the clock signal to the circuit block 40A can be stopped, and the supply of the clock signal to the circuit block 40B can be continued. The supply of the clock signal to the circuit block 40I and the supply of the clock signal to the circuit block 40J are independently controlled. Thus, the supply of the clock signal to the circuit block 40I can be stopped while the power can be supplied to the circuit blocks 40I and 40J, and the supply of the clock signal to the circuit block 40J can be continued.

The frequency of the clock signal supplied to the circuit block 40A and the frequency of the clock signal supplied to the circuit block 40B are independently controlled. The frequency of the clock signal supplied to the circuit block 40A and the frequency of the clock signal supplied to the circuit block 40B can be respectively controlled to different values. The frequency of the clock signal supplied to the circuit block 40A and the frequency of the clock signal supplied to the circuit block 40B can also be controlled to the same value.

The frequency of the clock signal supplied to the circuit block 40I and the frequency of the clock signal supplied to the circuit block 40J are independently controlled. The frequency of the clock signal supplied to the circuit block 40I and the frequency of the clock signal supplied to the circuit block 40J can be respectively controlled to different values. The frequency of the clock signal supplied to the circuit block 40I and the frequency of the clock signal supplied to the circuit block 40J can also be controlled to the same value.

The semiconductor device 1 may include a control circuit that controls the supply of the clock signal to the circuit blocks 40A to 40J, the stop of the supply of the clock signal to the circuit blocks 40A to 40J, and a change in frequency of the clock signal to the circuit blocks 40A to 40J. Processing for controlling the supply of the clock signal to the circuit blocks 40A to 40J, the stop of the supply of the clock signal to the circuit blocks 40A to 40J, and the change in frequency of the clock signal to the circuit blocks 40A to 40J is also written as signal control processing. Any one or a plurality of the circuit blocks 40A to 40J may function as a control circuit that performs signal control processing. Any one or a plurality of the circuit blocks 40A to 40J may function as a control circuit that performs power supply control processing and signal control processing. The control circuit that performs power supply control processing may perform signal control processing. A control device (e.g., a processor such as a CPU) different from the semiconductor device 1 may perform signal control processing. The control device may perform power supply control processing and signal control processing. The control device may be provided on the wiring substrate 10.

The semiconductor device 1 may include a clock signal supply circuit (clock generation circuit) that generates a clock signal and supplies the clock signal to the circuit blocks 40A to 40J. Examples of the clock signal supply circuit include a PLL (Phase Locked Loop) circuit. Any one or a plurality of the circuit blocks 40A to 40J may function as a clock signal supply circuit that generates a clock signal and supplies the clock signal to the circuit blocks 40A to 40J. A clock signal supply circuit may be provided outside the semiconductor device 1. The clock signal supply circuit may be provided on the wiring substrate 10.

The supply of the clock signal to the circuit blocks 40A to 40J can be stopped and resumed by an internal circuit in the semiconductor device 1. For example, the supply of the clock signal to the circuit blocks 40A to 40J may be stopped or resumed by controlling on or off of a clock gating circuit 60 formed in the semiconductor device 1.

Figure 3:
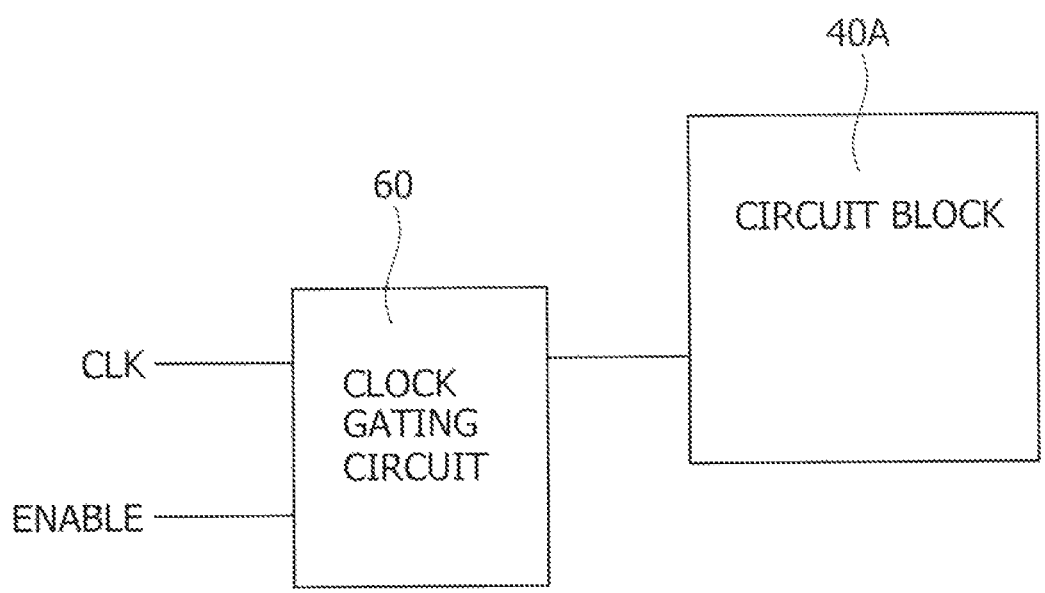
FIG. 3 is a diagram illustrating a clock gating circuit.

When an enable signal (control signal) is input to the clock gating circuit 60 from the control circuit or the control device, as illustrated in FIG. 3, on or off of the clock gating circuit 60 is controlled. When the clock gating circuit 60 is on, the clock gating circuit 60 supplies the clock signal to the circuit block 40A. When the clock gating circuit 60 is off, the clock gating circuit 60 stops the supply of the clock signal to the circuit block 40A. The semiconductor device 1 includes a plurality of clock gating circuits 60 respectively corresponding to the circuit blocks 40A to 40J.

Figure 4:
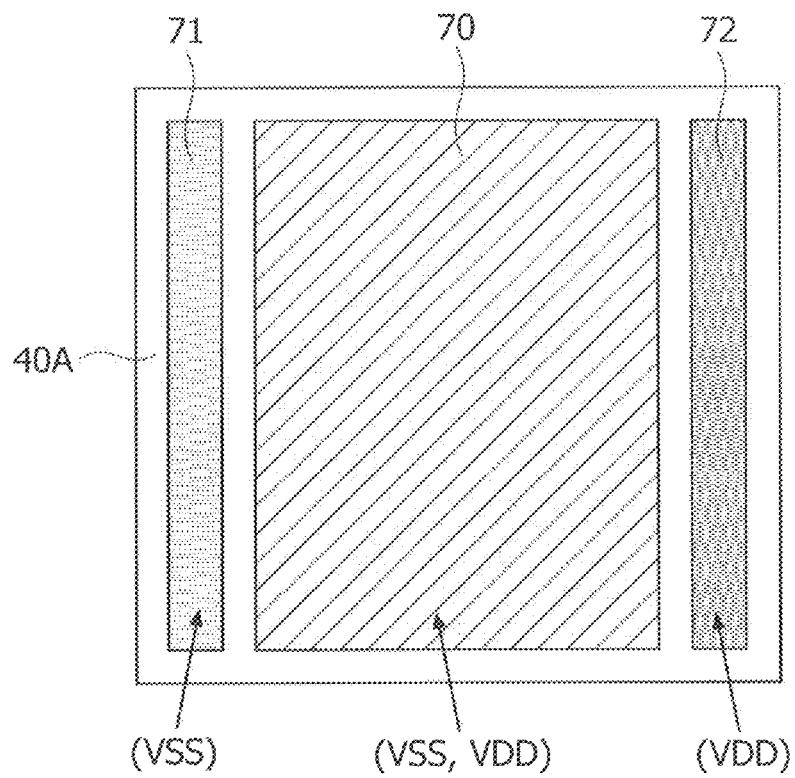
FIG. 4 is a diagram illustrating an example of a structure of a power supply network in the semiconductor device according to the embodiment.
Figure 5:
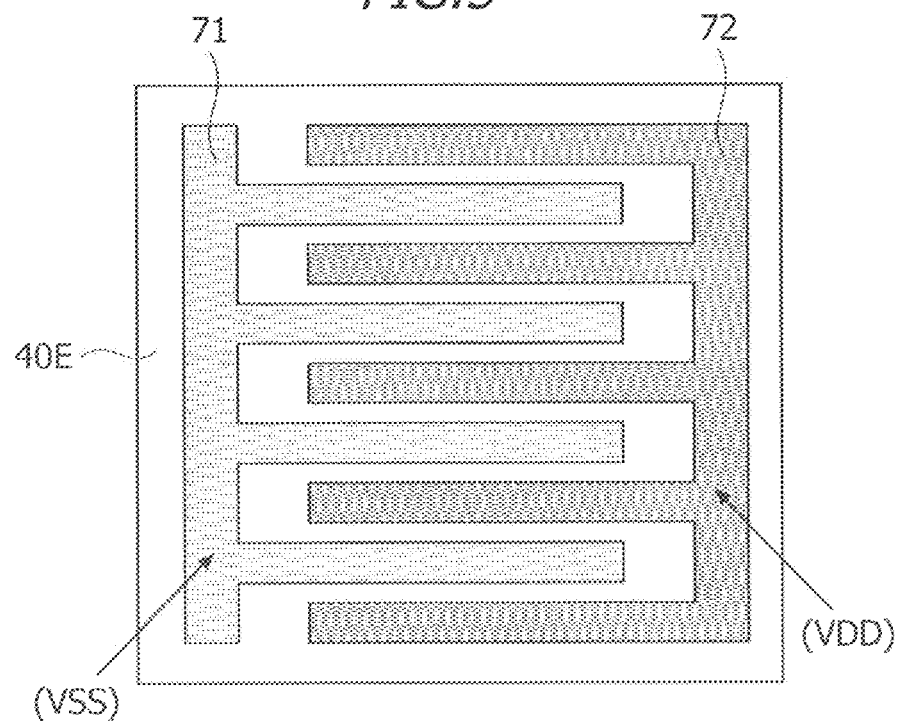
FIG. 5 is a diagram illustrating an example of a structure of a power supply network in the semiconductor device according to the embodiment.
Figure 6:
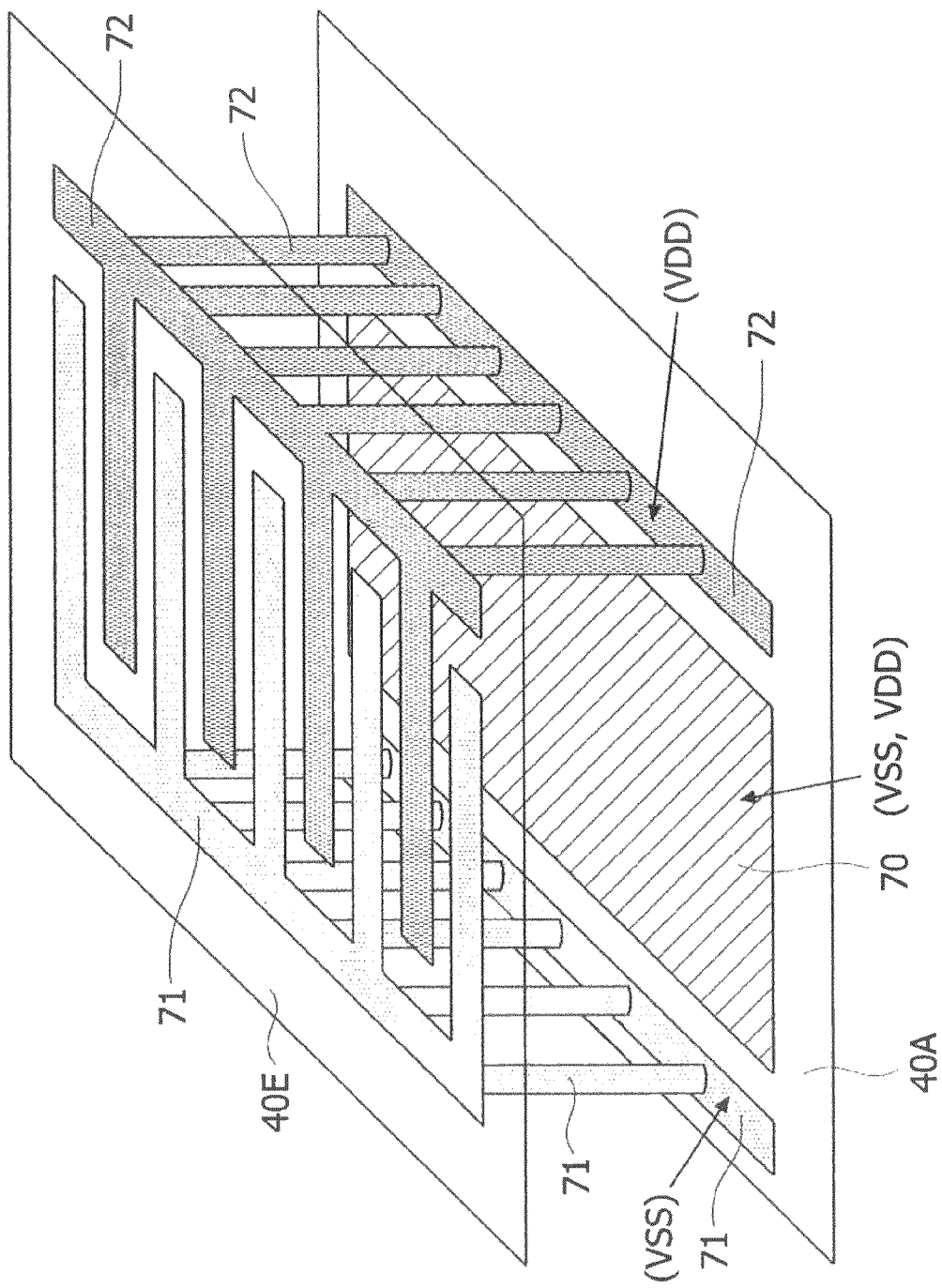
FIG. 6 is a diagram illustrating an example of a structure of a power supply network in the semiconductor device according to the embodiment.

FIGS. 4 to 6 illustrate an example of a structure of a power supply network in the semiconductor device 1 according to the embodiment. The structure of the power supply network illustrated in FIGS. 4 to 6 indicates respective structures of power supply networks in the circuit blocks 40A and 40E. FIG. 4 is a plan view of the circuit block 40A. FIG. 5 is a plan view of the circuit block 40E. FIG. 6 is a perspective view of the circuit blocks 40A and 40E. The structure of the power supply network illustrated in FIGS. 4 to 6 may be applied to respective structures of power supply networks in the two circuit blocks 40, which overlap each other in an up-and-down direction (vertical direction), among the circuit blocks 40B to 40D and 40F to 40H.

As illustrated in FIGS. 4 and 6, a power supply network 70 used to supply power to the circuit block 40A and power supply networks 71 and 72 used to supply power to the circuit block 40E are formed in the circuit block 40A. The power supply network 70 is formed in a central portion of the circuit block 40A. The power supply networks 71 and 72 are formed in the circuit block 40A in such a manner that the power supply network 70 formed in the central portion of the circuit block 40A is sandwiched therebetween. The power supply domain 50A has the power supply network 70, and the power is supplied to the circuit block 40A from the power supply domain 50A.

As illustrated in FIGS. 5 and 6, the power supply networks 71 and 72 used to supply power to the circuit block 40E are formed in the circuit block 40E. Each of the power supply networks 71 and 72 is in a comb shape. That is, each of the power supply networks 71 and 72 has a plurality of comb-teeth portions, and the plurality of comb-teeth portions of the power supply network 71 and the plurality of comb-teeth portions of the power supply network 72 are alternately arranged. The power supply domain 50E has the power supply networks 71 and 72, and the power is supplied to the circuit block 40E from the power supply domain 50E.

The power supply network 70 has a VSS (Voltage Source Source) wiring and a VDD (Voltage Drain Drain) wiring. The VSS wiring and the VDD wiring of the power supply network 70 are formed in the circuit block 40A. The power supply network 71 has a VSS wiring and a VSS TSV. The VSS wiring of the power supply network 71 is formed in each of the circuit blocks 40A and 40E. The VSS TSV of the power supply network 71 is formed between the circuit block 40A and the circuit block 40E. The power supply network 72 has a VDD wiring and a VDD TSV. The VDD wiring of the power supply network 72 is formed in each of the circuit blocks 40A and 40E. The VDD TSV of the power supply network 72 is formed between the circuit block 40A and the circuit block 40E. A ground voltage is supplied to the VSS wiring of the power supply network 70 and the VSS wiring and the VSS TSV of the power supply network 71. A power supply voltage is supplied to the VDD wiring of the power supply network 70 and the VDD wiring and the VDD TSV of the power supply network 72.

Figure 7:
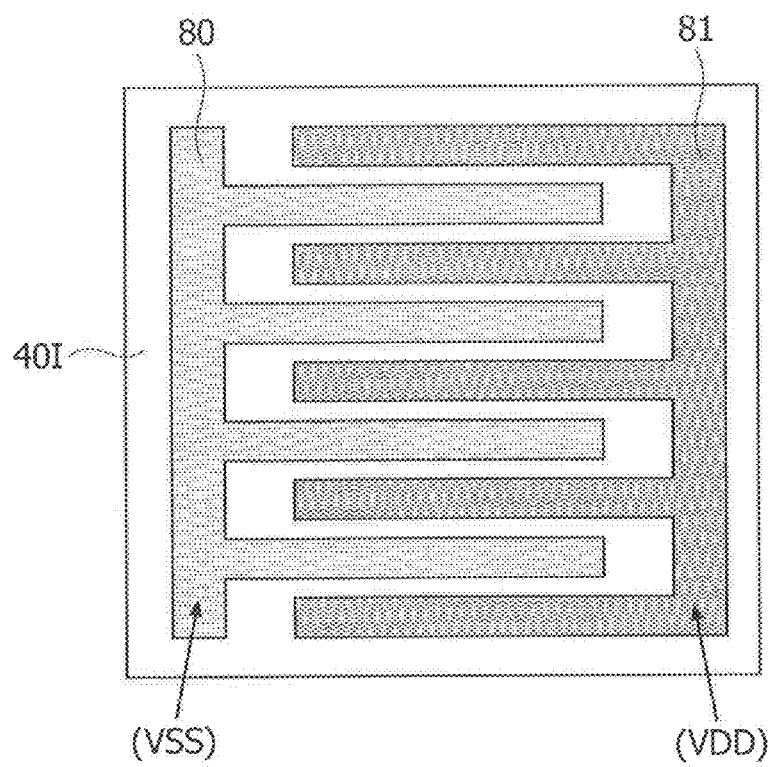
FIG. 7 is a diagram illustrating an example of a structure of a power supply network in the semiconductor device according to the embodiment.
Figure 8:
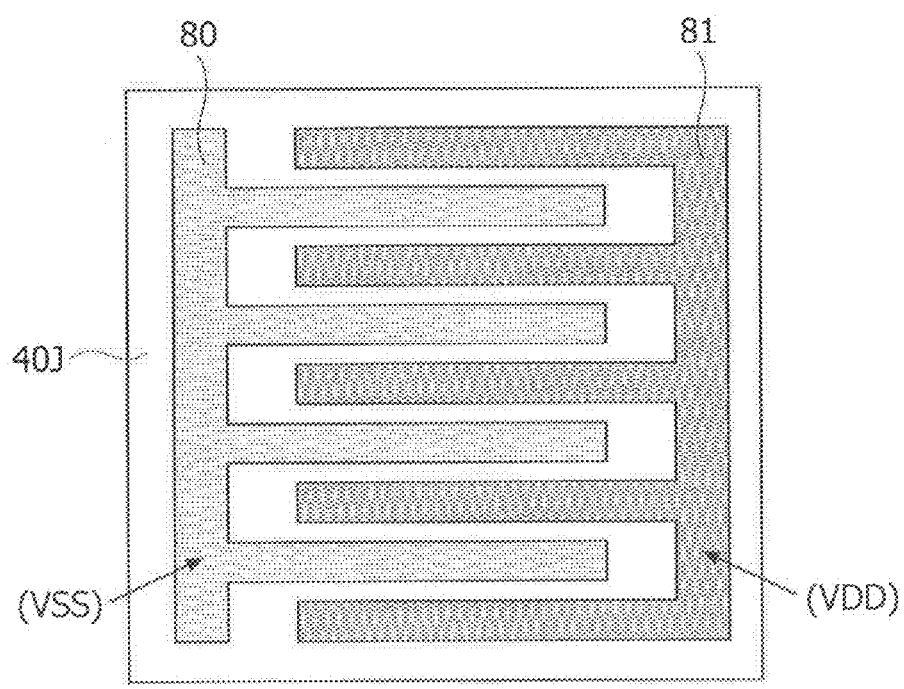
FIG. 8 is a diagram illustrating an example of a structure of a power supply network in the semiconductor device according to the embodiment.
Figure 9:
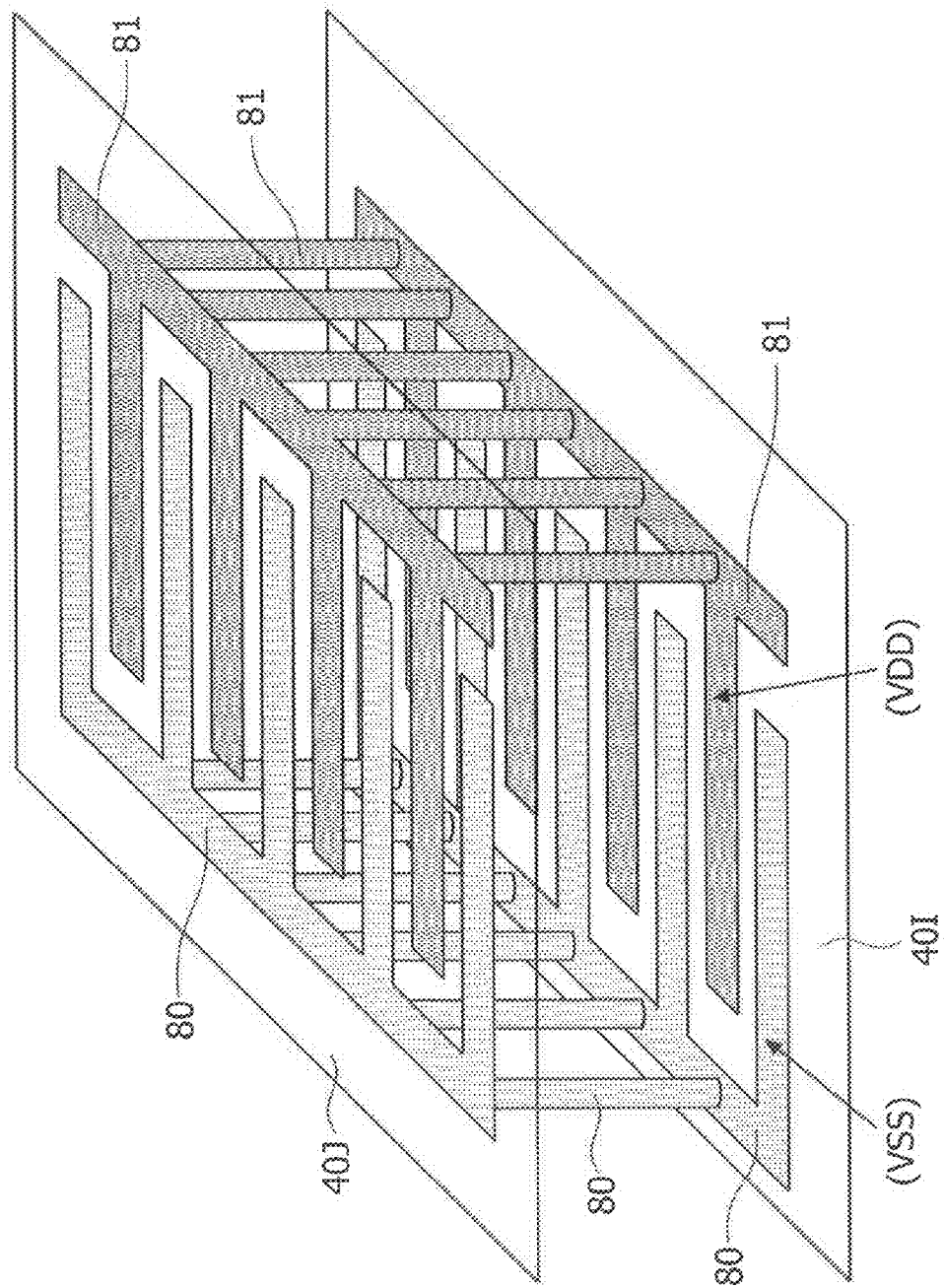
FIG. 9 is a diagram illustrating an example of a structure of a power supply network in the semiconductor device according to the embodiment.

FIGS. 7 to 9 illustrate an example of a structure of a power supply network in the semiconductor device 1 according to the embodiment. The structure of the power supply network illustrated in FIGS. 7 to 9 indicates respective structures of power supply networks in the circuit blocks 40I and 40J. FIG. 7 is a plan view of the circuit block 40I. FIG. 8 is a plan view of the circuit block 40J. FIG. 9 is a perspective view of the circuit blocks 40I and 40J.

As illustrated in FIGS. 7 and 9, power supply networks 80 and 81 used to supply power to the circuit block 40I are formed in the circuit block 40I. As illustrated in FIGS. 8 and 9, power supply networks 80 and 81 used to supply power to the circuit block 40J are formed in the circuit block 40J. As illustrated in FIGS. 8 and 9, each of the power supply networks 80 and 81 is in a comb shape. That is, each of the power supply networks 80 and 81 has a plurality of comb-teeth portions, and the plurality of comb-teeth portions of the power supply network 80 and the plurality of comb-teeth portions of the power supply network 81 are alternately arranged. The power supply domain 50I has the power supply networks 80 and 81, and the power is supplied to the circuit blocks 40I and 40J from the power supply domain 50I.

The power supply network 80 has a VSS wiring and a VSS TSV. The VSS wiring of the power supply network 80 is formed in each of the circuit blocks 40I and 40J. The VSS TSV of the power supply network 80 is formed between the circuit block 40I and the circuit block 40J. The power supply network 81 has a VDD wiring and a VDD TSV. The VDD wiring of the power supply network 81 is formed in each of the circuit blocks 40I and 40J. The VDD TSV of the power supply network 81 is formed between the circuit block 40I and the circuit block 40J. A ground voltage is supplied to the VSS wiring and the VSS TSV of the power supply network 80. A power supply voltage is supplied to the VDD wiring and the VDD TSV of the power supply network 81.

Figure 10:
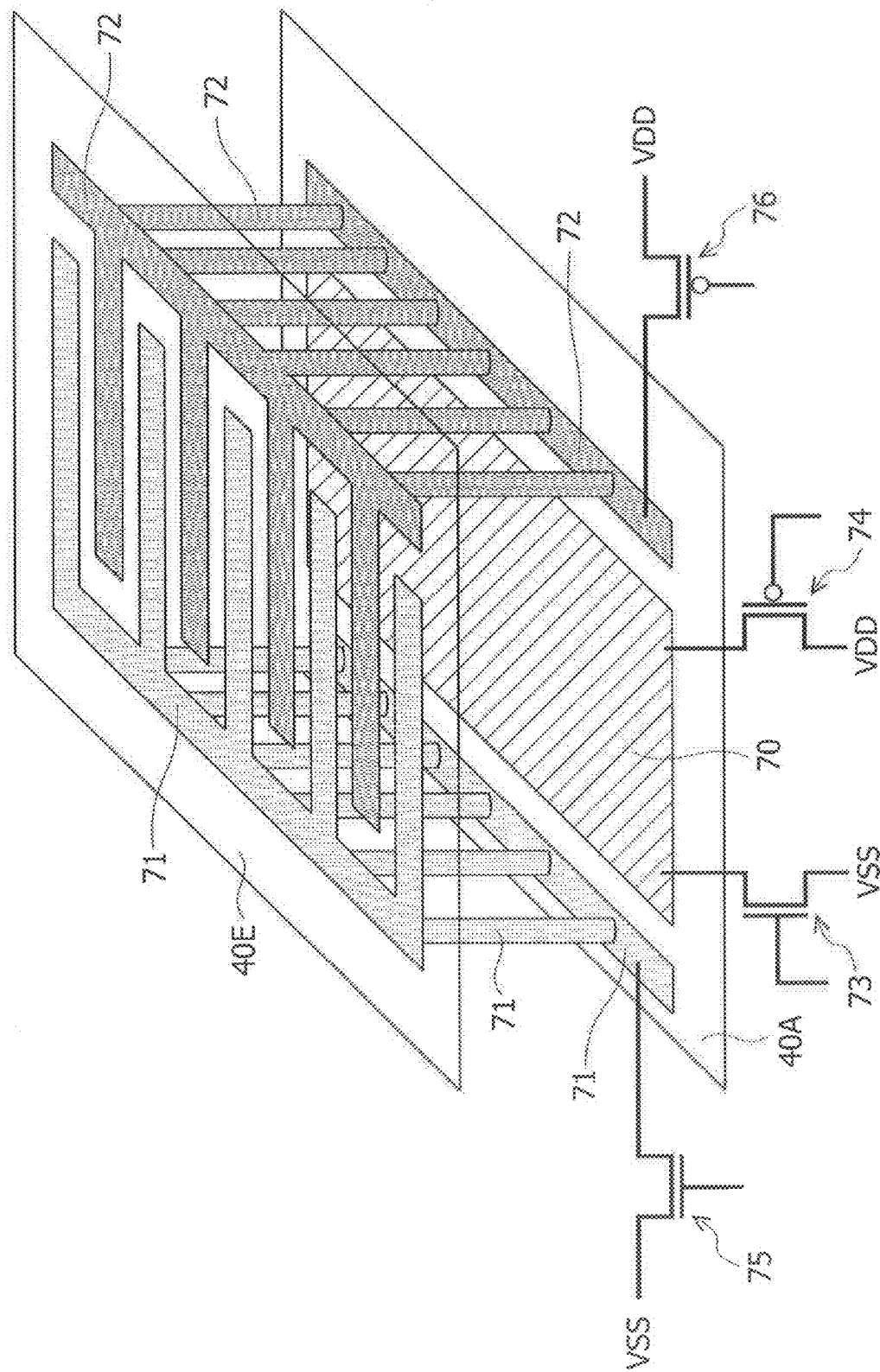
FIG. 10 is a diagram illustrating an example of a structure of a power supply network in the semiconductor device according to the embodiment.

FIG. 10 illustrates an example of a structure of a power supply network in the semiconductor device 1 according to the embodiment, and illustrates an example in which a power gating circuit is formed in the semiconductor device 1. The semiconductor device 1 includes power gating circuits 73 to 76. The power gating circuit 73 is arranged between a VSS wiring of a power supply network 70 and a VSS wiring formed in the semiconductor device 1. The power gating circuit 74 is arranged between a VDD wiring of the power supply network 70 and a VDD wiring formed in the semiconductor device 1. The power gating circuit 75 is arranged between a VSS wiring of a power supply network 71 and the VSS wiring formed in the semiconductor device 1. The power gating circuit 76 is arranged between a VDD wiring of a power supply network 72 and the VDD wiring formed in the semiconductor device 1.

The semiconductor chip 30 is arranged on the semiconductor chip 20. Therefore, a distance of the semiconductor chip 30 from the power supply IC 15 is longer than a distance of the semiconductor chip 20 from the power supply IC 15. Thus, the semiconductor chip 30 may drop in voltage more greatly than the semiconductor chip 20. A structure of a power supply network for suppressing the drop in voltage of semiconductor chips arranged on second and more layers will be described with reference to FIGS. 11A to 12B.

FIGS. 11A and 11B illustrate an example of a structure of a power supply network in the semiconductor device 1 according to the embodiment. The structure of the power supply network illustrated in FIGS. 11A and 11B indicates respective structures of power supply networks in the circuit blocks 40I and 40J. FIG. 11A is a plan view of the circuit block 40I. FIG. 11B is a plan view of the circuit block 40J.

As illustrated in FIG. 11A, power supply networks 90, 91, and 92 used to supply power to the circuit block 40I are formed in the circuit block 40I. As illustrated in FIG. 11B, power supply networks 90, 91, and 92 used to supply power to the circuit block 40J are formed in the circuit block 40J. The power supply domain 50I has the power supply networks 90, 91, and 92, and the power is supplied to the circuit blocks 40I and 40J from the power supply domain 50I.

The power supply network 90 has a VSS wiring and a VSS TSV. The VSS wiring of the power supply network 90 is formed in each of the circuit blocks 40I and 40J. The VSS TSV of the power supply network 90 is formed between the circuit block 40I and the circuit block 40J. The power supply network 91 has a VDD wiring and a VDD TSV. The VDD wiring of the power supply network 91 is formed in each of the circuit blocks 40I and 40J. The VDD TSV of the power supply network 91 is formed between the circuit block 40I and the circuit block 40J. The power supply network 92 has a VSS wiring, a VSS TSV, a VDD wiring, and a VDD TSV. The VSS wiring and the VDD wiring of the power supply network 92 are formed in each of the circuit blocks 40I and 40J. The VSS TSV and the VDD TSV of the power supply network 92 are formed between the circuit block 40I and the circuit block 40J. A ground voltage is supplied to the VSS wiring and the VSS TSV of the power supply network 90 and the VSS wiring and the VSS TSV of the power supply network 92. A power supply voltage is supplied to the VDD wiring and the VDD TSV of the power supply network 91 and the VDD wiring and the VDD TSV of the power supply network 92.

The power supply network 92 is formed in a central portion of the circuit block 40I, as illustrated in FIG. 11A, and the power supply network 92 is formed in a central portion of the circuit block 40J, as illustrated in FIG. 11B. Thus, respective voltage drops in the central portion of the circuit block 40I and the central portion of the circuit block 40J are suppressed. The power supply network 92 formed in the central portion of the circuit block 40J has a plurality of projection portions extending from the central portion to a peripheral portion of the circuit block 40J, as illustrated in FIG. 11B. When the power supply network 92 has the plurality of projection portions, the voltage drop in the circuit block 40J can be suppressed. A structure of the power supply network illustrated in FIGS. 11A and 11B may be applied to the circuit blocks 40A to 40H. In this case, a power supply network used to supply power to the circuit blocks 40A to 40D may be formed around the power supply network 90 illustrated in FIG. 11A.

FIGS. 12A and 12B illustrate an example of a structure of a power supply network in the semiconductor device 1 according to the embodiment. The structure of the power supply network illustrated in FIGS. 12A and 12B indicates respective structures of power supply networks in circuit blocks 40I and 40J. FIG. 12A is a plan view of the circuit block 40I. FIG. 12B is a plan view of the circuit block 40J.

As illustrated in FIG. 12A, a plurality of power supply networks 100 and 101 used to supply power to the circuit block 40I are formed in the circuit block 40I. As illustrated in FIG. 12B, a plurality of power supply networks 100 and 101 used to supply power to the circuit block 40J are formed in the circuit block 40J. As illustrated in FIGS. 12A and 12B, the plurality of power supply networks 100 and 101 are formed in each of the circuit blocks 40I and 40J in such a manner that the power supply network 100 and the power supply network 101 are adjacent to each other. The power supply domain 50I has the power supply networks 100 and 101, and the power is supplied to the circuit blocks 40I and 40J from the power supply domain 50I.

The power supply network 100 has a VSS wiring and a VSS TSV. The VSS wiring of the power supply network 100 is formed in each of the circuit blocks 40I and 40J. The VSS TSV of the power supply network 100 is formed between the circuit block 40I and the circuit block 40J. The power supply network 101 has a VDD wiring and a VDD TSV. The VDD wiring of the power supply network 101 is formed in each of the circuit blocks 40I and 40J. The VDD TSV of the power supply network 101 is formed between the circuit block 40I and the circuit block 40J. A ground voltage is supplied to the VSS wiring and the VSS TSV of the power supply network 100. A power supply voltage is supplied to the VDD wiring and the VDD TSV of the power supply network 101.

As illustrated in FIG. 12A, a pair of power supply networks 102 each including the power supply network 100 and the power supply network 101 adjacent to each other is arranged in the circuit block 40I. When the plurality of power supply networks 102 are arranged at a predetermined distance apart from one another from one end to the other end of the circuit block 40I, a voltage drop in the circuit block 40I can be suppressed. As illustrated in FIG. 12B, a pair of power supply networks 103 each including the power supply network 100 and the power supply network 101 adjacent to each other is arranged in the circuit block 40J. When the plurality of power supply networks 103 are arranged at a predetermined distance apart from one another from one end to the other end of the circuit block 40J, a voltage drop in the circuit block 40J can be suppressed.

Power supply control processing and signal control processing may be performed based on respective states of the circuit blocks 40A to 40J. Power supply control processing and signal control processing may be performed based on respective voltage values and voltage drop amounts in the circuit blocks 40A to 40J. When the voltage drop in the circuit block 40A occurs, for example, an amount of the power supplied to the circuit block 40A may be insufficient. The supply of the power to the circuit block 40B or the circuit block 40C arranged around the circuit block 40A may be stopped, or the supply of the power to the circuit block 40B and 40C may be stopped. Thus, the amount of the power supplied to the circuit block 40A increases so that the voltage drop in the circuit block 40A can be suppressed.

When the voltage drop in the circuit block 40J occurs, for example, an amount of the power supplied to the circuit block 40J may be insufficient. The supply of the power to the circuit block 40G or the circuit block 40H arranged around the circuit block 40J may be stopped, or the supply of the power to the circuit block 40G and 40H may be stopped. Thus, the amount of the power supplied to the circuit block 40J increases so that the voltage drop in the circuit block 40J can be suppressed. In this case, the power supply to the circuit block 40I to which power common to that supplied to the circuit block 40J is supplied is not stopped.

The power supply voltage of the power supplied to the circuit block 40A may be lowered. When the power supply voltage of the power supplied to the circuit block 40A is lowered, power consumption of the circuit block 40A decreases. Therefore, the voltage drop in the circuit block 40A can be suppressed. The power supply voltage of the power supplied to the circuit block 40B or the circuit block 40C may be lowered, or the respective power supply voltages of the power supplied to the circuit blocks 40B and 40C may be lowered. Thus, power consumption of each of the circuit blocks 40B and 40C decreases. Therefore, the amount of the power supplied to the circuit block 40A increases so that the voltage drop in the circuit block 40A can be suppressed.

The respective power supply voltages of the power supplied to the circuit blocks 40I and 40J may be lowered. The respective power supply voltages of the power supplied to the circuit blocks 40I and 40J are common. Therefore, the respective power supply voltages of the power supplied to the circuit blocks 40I and 40J are changed in common. When the respective power supply voltages of the power supplied to the circuit blocks 40I and 40J are lowered, power consumption of each of the circuit blocks 40I and 40J decreases. Therefore, the voltage drop in the circuit block 40J can be suppressed. The power supply voltage of the power supplied to the circuit block 40G or the circuit block 40H may be lowered, or the respective power supply voltages of the power supplied to the circuit blocks 40G and 40H may be lowered. Thus, power consumption of each of the circuit blocks 40G and 40H decreases. Therefore, the amount of the power supplied to the circuit block 40J increases so that the voltage drop in the circuit block 40J can be suppressed.

The frequency of the clock signal supplied to the circuit block 40A may be reduced. When the frequency of the clock signal supplied to the circuit block 40A is reduced, the power consumption of the circuit block 40A decreases. Therefore, the voltage drop in the circuit block 40A can be suppressed. The supply of the clock signal to the circuit block 40B or the circuit block 40C may be stopped, or the supply of the clock signal to the circuit blocks 40B and 40C may be stopped. Thus, the power consumption of each of the circuit blocks 40B and 40C decreases. Therefore, the amount of the power supplied to the circuit block 40A increases so that the voltage drop in the circuit block 40A can be suppressed.

The frequency of the clock signal supplied to the circuit block 40J may be reduced. The clock signal is independently supplied to the circuit blocks 40I and 40J. Therefore, the respective frequencies of the clock signal supplied to the circuit blocks 40I and 40J are independently changed. When the frequency of the clock signal supplied to the circuit block 40J is reduced, the power consumption of the circuit block 40J decreases. Therefore, the voltage drop in the circuit block 40J can be suppressed. The supply of the clock signal to the circuit block 40H or the circuit block 40I may be stopped, or the supply of the clock signal to the circuit blocks 40H and 40I may be stopped. The frequency of the clock signal supplied to the circuit block 40H or the circuit block 40I may be reduced, or the respective frequencies of the clock signal supplied to the circuit blocks 40H and 40I may be reduced. Thus, the power consumption of each of the circuit blocks 40H and 40I decreases. Therefore, the amount of the power supplied to the circuit block 40J increases so that the voltage drop in the circuit block 40J can be suppressed.

The supply of the power to the circuit blocks 40A to 40J may be stopped, and the supply of the clock signal to the circuit blocks 40A to 40J may be stopped. The respective power supply voltages of the power supplied to the circuit blocks 40A to 40J may be reduced, and the respective frequencies of the clock signal supplied to the circuit blocks 40A to 40J may be reduced.

Power supply control processing and signal control processing may be performed based on respective temperature values and amounts of rise in temperature of the circuit blocks 40A to 40J. When the temperature of the circuit block 40A excessively rises, the circuit block 40A may malfunction or may fail. When the temperature of the circuit block 40A excessively rises, the supply of the power to the circuit block 40A is stopped so that the rise in temperature of the circuit block 40A can be suppressed. When the temperature of the circuit block 40A excessively rises, the frequency of the clock signal supplied to the circuit block 40A is reduced so that the rise in temperature of the circuit block 40A can be suppressed. When the excessive rise in temperature of the circuit block 40A is suppressed, the malfunction and the failure of the circuit block 40A can be avoided.

Power supply control processing and signal control processing may be performed based on timing violation information about the circuit blocks 40A to 40J. For example, timing violation between flip-flops in the circuit block 40A may occur due to the voltage drop in the circuit block 40A. When timing violation between the flip-flops in the circuit block 40A is detected, the voltage drop in the circuit block 40A can be detected. When timing violation between the flip-flops in the circuit block 40A occurs, the supply of the power to the circuit block 40B or the circuit block 40C may be stopped, or the supply of the power to the circuit blocks 40B and 40C may be stopped. When timing violation between the flip-flops in the circuit block 40A occurs, the frequency of the clock signal supplied to the circuit block 40A may be reduced.

The circuit blocks 40A to 40J may be respectively provided with detection units that detect the states of the circuit blocks 40A to 40J. The detection unit may be a sensor that detects the voltage drop in the circuit block 40. The detection unit may be a sensor that outputs a detection signal when an amount of the voltage drop in the circuit block 40 exceeds a predetermined amount. The detection unit may be a temperature sensor that measures the temperature of the circuit block 40 and outputs a detection signal when the temperature of the circuit block 40 exceeds a predetermined value. The temperature sensor may be a sensor of a type using a band gap of a diode, for example. The detection unit may output a detection signal when timing violation occurs between the flip-flops in the circuit block 40. The detection unit may be a circuit that detects timing violation among a plurality of flip-flops in the circuit block 40. Examples of a circuit, which detects timing violation, include a Canary flip-flop circuit and a Razor circuit.

Figure 13A:
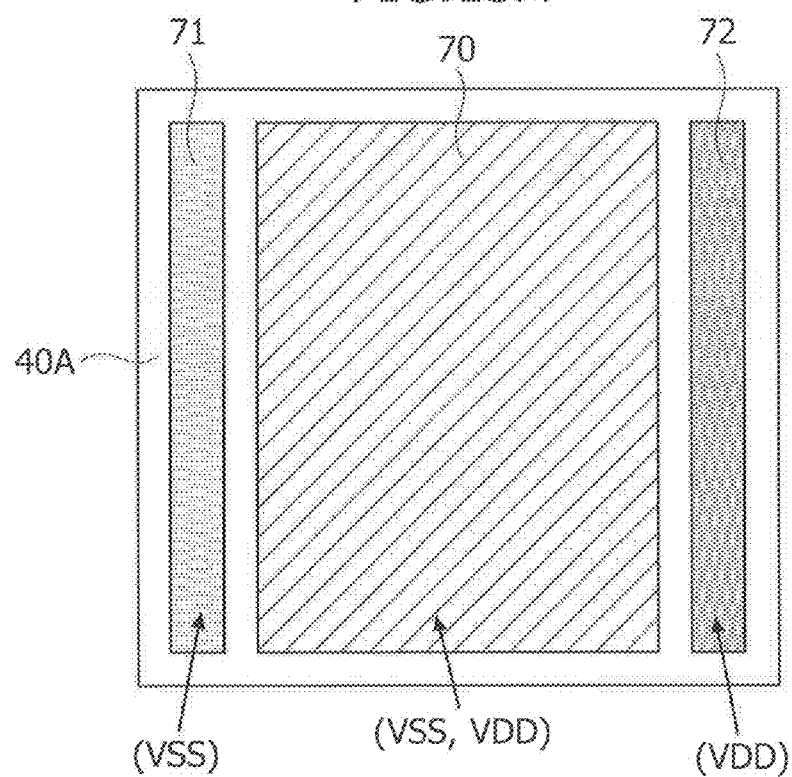
FIG. 13A is a diagram illustrating an example of an arrangement of detection units.
Figure 13B:
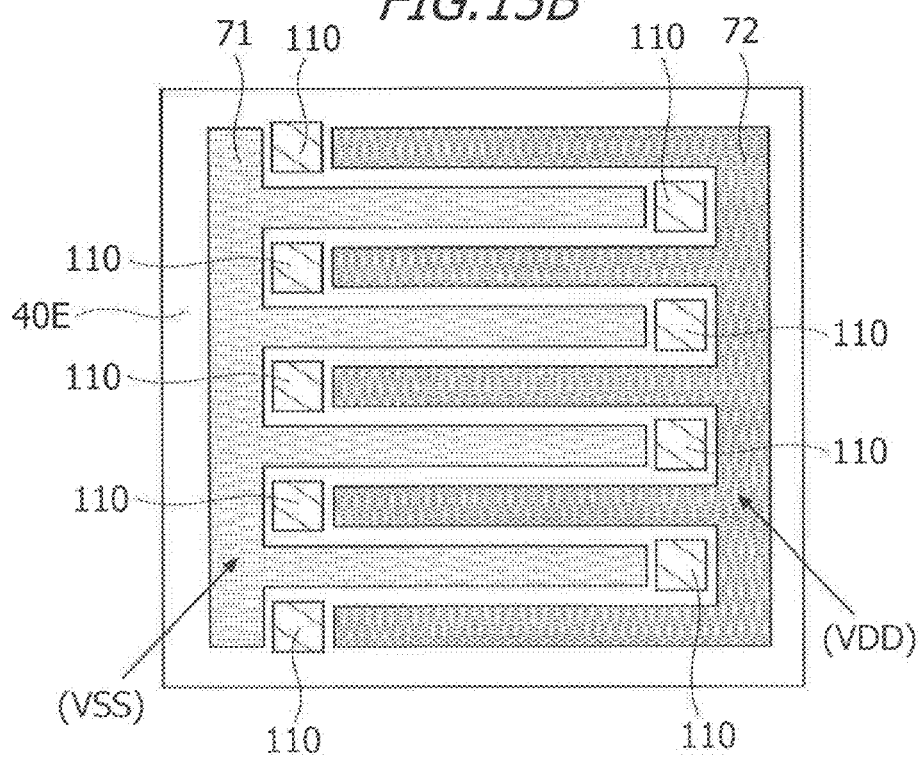
FIG. 13B is a diagram illustrating an example of an arrangement of detection units.

FIGS. 13A to 15B each illustrate an example of an arrangement of detection units. FIG. 13A is a plan view of the circuit block 40A. FIG. 13B is a plan view of the circuit block 40E. In the example of the arrangement of detection units 110 illustrated in FIGS. 13A and 13B, the detection unit 110 is not arranged in the circuit block 40A, and the plurality of detection units 110 are arranged in the circuit block 40E. The plurality of detection units 110 are arranged between a power supply network 71 and a power supply network 72 formed in the circuit block 40E. The number of the detection units 110 is optional. When at least one of the detection units 110 is arranged in the circuit block 40E, a state of the circuit block 40E can be detected.

Figure 14A:
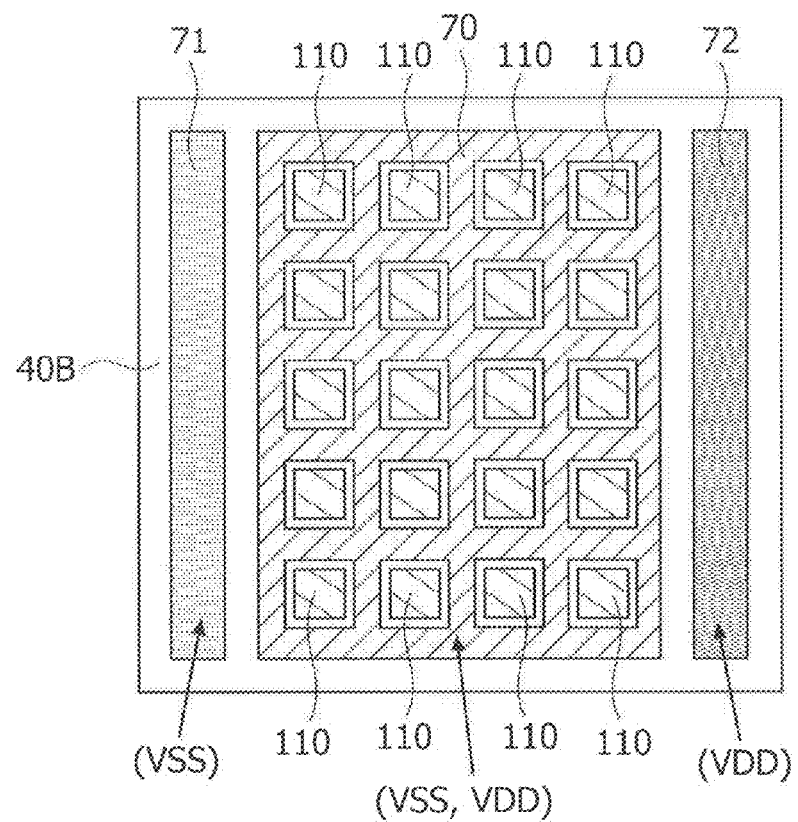
FIG. 14A is a diagram illustrating an example of an arrangement of detection units.
Figure 14B:
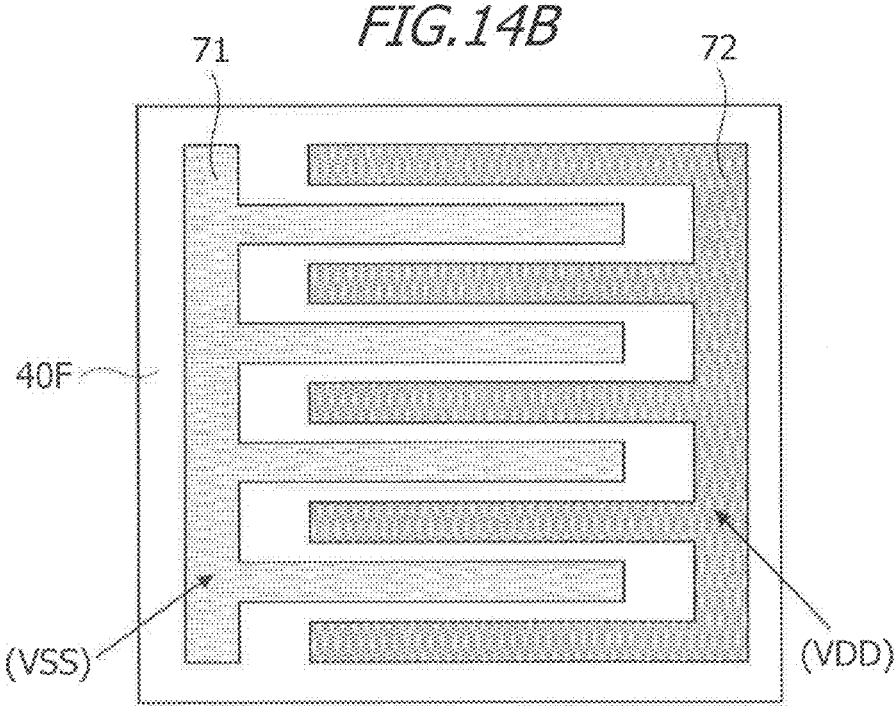
FIG. 14B is a diagram illustrating an example of an arrangement of detection units.

FIG. 14A is a plan view of the circuit block 40B. FIG. 14B is a plan view of the circuit block 40F. In the example of the arrangement of detection units 110 illustrated in FIGS. 14A and 14B, the plurality of detection units 110 are arranged in the circuit block 40B, and the detection unit 110 is not arranged in the circuit block 40F. The number of the detection units 110 is optional. When at least one of the detection units 110 is arranged in the circuit block 40B, a state of the circuit block 40B can be detected.

Figure 15A:
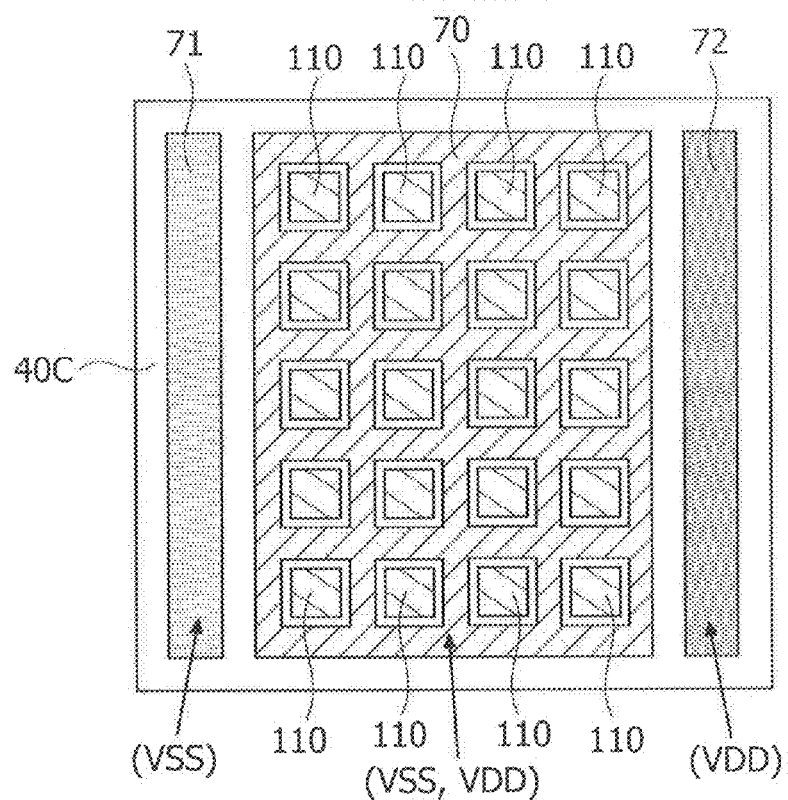
FIG. 15A is a diagram illustrating an example of an arrangement of detection units.
Figure 15B:
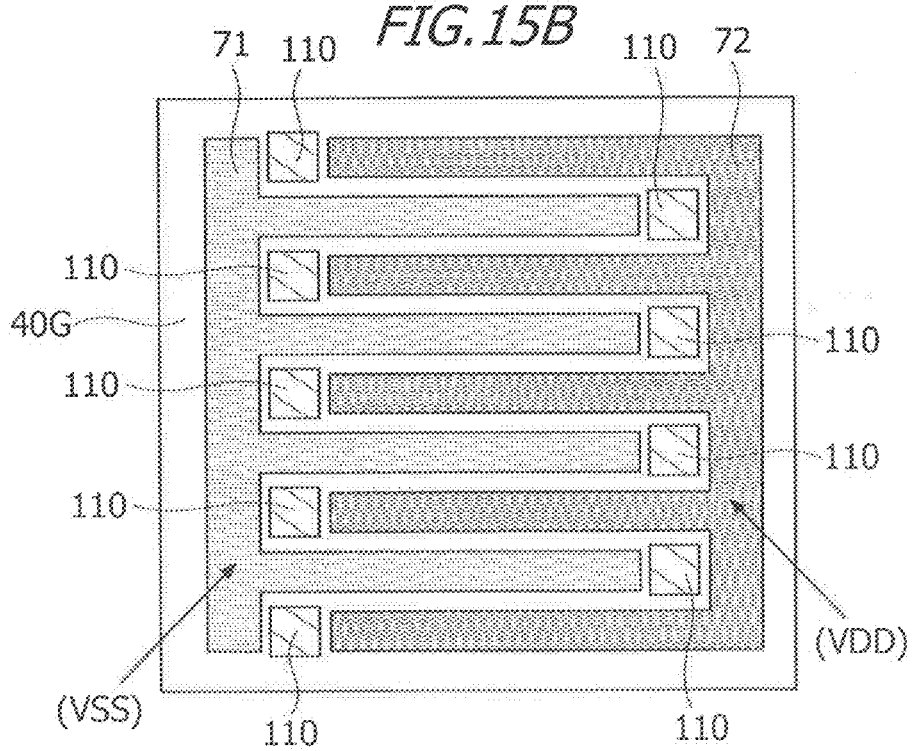
FIG. 15B is a diagram illustrating an example of an arrangement of detection units.

FIG. 15A is a plan view of the circuit block 40C. FIG. 15B is a plan view of the circuit block 40G. In the example of the arrangement of detection units 110 illustrated in FIGS. 15A and 15B, the plurality of detection units 110 are arranged in the circuit block 40C, and the plurality of detection units 110 are arranged in the circuit block 40G. The number of the detection units 110 is optional. When at least one of the detection units 110 is arranged in the circuit block 40C, a state of the circuit block 40C can be detected. When at least one of the detection units 110 is arranged in the circuit block 40G, a state of the circuit block 40G can be detected.

Each of the circuit blocks 40A to 40J may include a performance counter. Power supply control processing and signal control processing may be performed by respectively reading out status of use (the number of times of use) of the circuit blocks 40A to 40J from the performance counters. When the number of times of use of the circuit block 40A per unit time exceeds a threshold value, for example, the supply of the power to the circuit block 40B and the circuit block 40C arranged around the circuit block 40A may be stopped. Based on information about the performance counters, the control circuit or the control device may perform power supply control processing and signal control processing or an operating system (OS) or firmware may perform power supply control processing and signal control processing. The OS and the firmware may be stored in each of the circuit blocks 40A to 40J, or may be stored in a storage device such as a memory different from the semiconductor device 1.

Power supply control processing and signal control processing may be performed based on information about a program to be executed by at least one of the circuit blocks 40A to 40J. Power supply control processing and signal control processing may be performed based on information such as an execution phase of a program to be executed by at least one of the circuit blocks 40A to 40J, the property of the program, and a combination of a plurality of programs.

The execution phase of a program will be described. One program can be divided into a plurality of phases. Examples of the phase include phases for preparing data needed for processing, calculating some data, accessing data in a memory, accessing data in another machine, performing a single precision arithmetic, and performing a double precision arithmetic. Each of the phases can simultaneously perform a plurality of processes by performing pipeline processing using a pipeline. However, the plurality of processes may be simultaneously unprocessable due to occurrence of a data dependence relationship, and the plurality of processes may be simultaneously unprocessable due to conflict of hardware resources. When a phase frequently using a specific arithmetic unit is executed, for example, power supply control processing and signal control processing may be performed so that a voltage drop in the circuit block 40 including the arithmetic unit used to execute the phase does not occur based on information about the execution phase.

Information about the property of a program includes information about a difference in usage rate among the circuit blocks 40A to 40J respectively used for the programs. In an arithmetic operation of a science technology program, for example, the usage rate of a double precision arithmetic unit is high, and the usage rate of a single precision arithmetic unit is low. On the other hand, in an arithmetic operation of a program other than the science technology program, the usage rate of the double precision arithmetic unit is low. Therefore, in the programs that differ in property, a region on a circuit used during execution differs. Therefore, a difference occurs among the usage rates of the circuit blocks 40A to 40J respectively used for the programs. When the usage rate of the circuit block 40A is high, power supply control processing and signal control processing may be performed for the circuit blocks 40B and 40C arranged around the circuit block 40A so that the voltage drop in the circuit block 40A does not occur.

Information about a combination of a plurality of programs includes information about conflict among the circuit blocks 40A to 40J used for the programs. If the same circuit block 40 is used when the plurality of programs are executed, conflict occurs in the circuit block 40. When conflict occurs in the circuit block 40A, for example, power supply control processing and signal control processing may be performed for the circuit blocks 40B and 40C arranged around the circuit block 40A so that the voltage drop in the circuit block 40A does not occur.

An example in which the supply of the power and the stop of the supply of the power are performed to the circuit block 40I in the semiconductor chip 20 and the circuit block 40J in the semiconductor chip 30 in common has been illustrated above. The embodiment is not limited to this example. The supply of the power and the stop of the supply of the power may be performed to at least two of the circuit blocks 40A to 40D in the semiconductor chip 20 in common. The supply of the power and the stop of the supply of the power may be performed to at least two of the circuit blocks 40E to 40H in the semiconductor chip 30 in common.

In the semiconductor device 1, the power can be independently supplied to the circuit blocks 40A to 40H, and the power can be supplied to the circuit blocks 40I and 40J in common. For example, the supply of the power to the circuit block 40E in the semiconductor chip 30 is stopped, to supply the power to the circuit block 40A in the semiconductor chip 20. Thus, a current preferentially flows through the circuit block 40A so that the circuit block 40A can be preferentially operated. For example, the power is supplied to the circuit blocks 40A to 40D in the semiconductor chip 20 to operate the circuit blocks 40A to 40D so that the supply of the power to the circuit blocks 40E to 40H in the semiconductor chip 30 can be stopped. For example, the power is supplied to the circuit block 40I in the semiconductor chip 20 and the circuit block 40J in the semiconductor chip 30 to operate the circuit blocks 40J and 40I so that the supply of the power to the circuit blocks 40A to 40H can be stopped.

When the supply of the power to at least one of the circuit blocks 40A to 40H is stopped, respective amounts of the power supplied to the other circuit blocks 40 and the circuit blocks 40I and 40J can be increased. The power consumption of at least one of the circuit blocks 40A to 40H can be reduced. When the power consumption of each of the circuit blocks 40A to 40H is reduced, heat generation by the circuit blocks 40A to 40H is suppressed. When the supply of the power to the circuit blocks 40I and 40J is stopped, the respective amounts of the power supplied to the circuit blocks 40A to 40H can be increased. The power consumption of each of the circuit blocks 40I and 40J can be reduced. When the power consumption of each of the circuit blocks 40I and 40J is reduced, heat generation by the circuit blocks 40I and 40J is suppressed. Therefore, according to the embodiment, the power can be efficiently supplied to the semiconductor device 1 so that heat generation by the semiconductor device 1 can be suppressed.

When the power supply voltage of the power supplied to at least one of the circuit blocks 40A to 40H is lowered, the respective amounts of the power supplied to the other circuit blocks 40 and the circuit blocks 40I and 40J can be increased. The power consumption of at least one of the circuit blocks 40A to 40H can be reduced. When the respective power supply voltages of the power supplied to the circuit blocks 40I and 40J are lowered, the respective amounts of the power supplied to the circuit blocks 40A to 40H can be increased. The power consumption of each of the circuit blocks 40I and 40J can be reduced. Therefore, according to the embodiment, the power can be efficiently supplied to the semiconductor device 1 so that the heat generation by the semiconductor device 1 can be suppressed.

When the supply of the clock signal to at least one of the circuit blocks 40A to 40J is stopped, the respective amounts of the power supplied to the other circuit blocks 40 can be increased. When the frequency of the clock signal supplied to at least one of the circuit blocks 40A to 40J is reduced, the respective amounts of the power supplied to the other circuit blocks 40 can be increased. The power consumption of at least one of the circuit blocks 40A to 40J can be reduced. Therefore, according to the embodiment, the power can be efficiently supplied to the semiconductor device 1 so that the heat generation by the semiconductor device 1 can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a plurality of semiconductor chips which are stacked;
   a plurality of circuit blocks respectively included in the plurality of semiconductor chips;
   a first power supply domain that supplies power and stops the supply of the power to one of the plurality of circuit blocks independently of the other circuit blocks; and
   a second power supply domain that supplies power and stops the supply of the power to at least two of the plurality of circuit blocks in common and supplies the power and stops the supply of the power independently of the other circuit blocks.

2. The semiconductor device according to claim 1, wherein the supply of the power to the circuit block in the first power supply domain is stopped or the supply of the power to the at least two circuit blocks in the second power supply domain is stopped, based on respective states of the plurality of circuit blocks.

3. The semiconductor device according to claim 2, further comprising a plurality of detection units that respectively detect the states of the plurality of circuit blocks.

4. The semiconductor device according to claim 1, wherein
   clock signals are respectively independently supplied to the plurality of circuit blocks, and
   the supply of the clock signal to at least one of the circuit blocks is stopped or control to reduce a frequency of the clock signal supplied to at least one of circuit blocks is performed, based on respective states of the plurality of circuit blocks.

5. The semiconductor device according to claim 1, wherein the supply of the power to the one of the plurality of the circuit blocks in the first power supply domain is stopped or the supply of the power to the at least two circuit blocks in the second power supply domain is stopped, based on information about a program to be executed by the at least one circuit block.

6. The semiconductor device according to claim 1, wherein
   clock signals are respectively independently supplied to the plurality of circuit blocks, and
   the supply of the clock signal to at least one of the circuit blocks is stopped or control to reduce a frequency of the clock signal supplied to the at least one circuit block is performed, based on information about a program to be executed by the at least one circuit block.

7. The semiconductor device according to claim 1, wherein
- a power supply voltage of the power supplied to the one of the plurality of the circuit blocks and a power supply voltage of the power supplied to the other circuit blocks are independently controlled in the first power supply domain,
- respective power supply voltages of the power supplied to the at least two circuit blocks are controlled in common in the second power supply domain, and
- control to lower the power supply voltage of the power supplied to the at least one circuit block in the first power supply domain is performed or control to lower the respective power supply voltages of the power supplied to the at least two circuit blocks in the second power supply domain is performed, based on respective states of the plurality of circuit blocks.

8. A method of controlling a semiconductor device comprising a plurality of semiconductor chips which are stacked and a plurality of circuit blocks respectively included in the plurality of semiconductor chips, the control method comprising:
- supplying power and stopping the supply of the power to one of the plurality of circuit blocks independently of the other circuit blocks by a first power supply domain in the semiconductor device; and
- supplying power and stopping the supply of the power to at least two of the plurality of circuit blocks in common and supplying the power and stopping the supply of the power independently of the other circuit blocks by a second power supply domain in the semiconductor device.

* * * * *